US00RE41031E

(19) United States
(12) Reissued Patent
Majos

(10) Patent Number: US RE41,031 E
(45) Date of Reissued Patent: Dec. 1, 2009

(54) FREQUENCY CONTROL SYSTEM THAT STABILIZES AN OUTPUT THROUGH BOTH A COUNTER AND VOLTAGE-CONTROLLED OSCILLATOR VIA SAMPLING A GENERATED CLOCK INTO FOUR STATES

(76) Inventor: Jacques Majos, 18 Lotissement Les Jonquilles, Le Versoud (FR), 38420

(21) Appl. No.: 11/367,051

(22) Filed: Mar. 2, 2006

Related U.S. Patent Documents

Reissue of:
(64) Patent No.: 6,701,445
Issued: Mar. 2, 2004
Appl. No.: 09/559,524
Filed: Apr. 28, 2000

(30) Foreign Application Priority Data

Apr. 30, 1999 (FR) ..... 99 05627

(51) Int. Cl.
*G06F 1/04* (2006.01)
*G06F 1/08* (2006.01)
*G06F 11/00* (2006.01)

(52) U.S. Cl. ..... 713/500; 713/501; 713/502; 713/503; 327/151; 327/156

(58) Field of Classification Search ..... 713/400, 713/500, 501, 503, 502; 331/1; 327/100, 327/150, 151, 156
See application file for complete search history.

(56) References Cited

U.S. PATENT DOCUMENTS 4,030,045 A 6/1977 Clark
4,031,478 A * 6/1977 Clark ..... 327/7
4,095,267 A 6/1978 Morimoto
4,456,890 A * 6/1984 Carickhoff ..... 331/1 A
4,572,995 A 2/1986 Enami
4,682,343 A * 7/1987 Pfiffner ..... 375/295
4,912,730 A 3/1990 Erhart
4,932,041 A * 6/1990 Eiberger et al. ..... 375/376
5,552,727 A 9/1996 Nakao
5,910,741 A * 6/1999 Watanabe ..... 327/150
6,060,953 A 5/2000 Tsai
6,154,071 A 11/2000 Nogawa
6,266,799 B1 7/2001 Lee et al.

FOREIGN PATENT DOCUMENTS

EP 0302562 2/1989
EP 0433120 6/1991
EP 0 716 511 A1 * 6/1996
EP 0716511 6/1996
JP 61216524 9/1986

* cited by examiner

*Primary Examiner*—Mark Connolly

(57) ABSTRACT

A frequency control system includes a voltage-controlled oscillator, a sampling circuit for sampling a clock signal produced by the oscillator for two consecutive transitions of an unstable incoming digital signal, and a frequency comparator for incrementing and decrementing a transition upcounter-downcounter controlling the oscillator. The system tolerates variation of the frequency of the incoming signal about a mean value, which has no effect on a clock signal to be extracted by means of a phase comparator or on the synthesized clock signal supplied by the oscillator if the incoming signal contains a high level of jitter and is supplied by a programmable frequency divider.

56 Claims, 4 Drawing Sheets

FREQUENCY CONTROL SYSTEM THAT STABILIZES AN OUTPUT THROUGH BOTH A COUNTER AND VOLTAGE-CONTROLLED OSCILLATOR VIA SAMPLING A GENERATED CLOCK INTO FOUR STATES

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a frequency control system for extracting a clock signal from a high bit rate digital signal or for synthesizing a frequency. The system comprises a circuit loop including a voltage-controlled oscillator (VCO) slaved to an incoming signal of unstable frequency.

2. Description of the Prior Art

The frequency control of a VCO is used in a receiver in order to extract from a digital data signal an original clock signal produced by a transmitter which transmitted the data signal. Frequency synthesis using a VCO is used in radio transmitters and receivers when it is necessary to generate precise frequencies for selecting a channel. In these two applications, the main technical problem is to extract the clock signal contained in the received digital data signal, which is affected by noise, i.e. which contains jitter, and to synthesize a precise frequency based on an unstable reference frequency.

The invention has applications in the field of digital transmissions at high bit rates, up to several hundred Mbit/s, for recovering the clock signal needed to process the received data, and in the field of radio equipments, for synthesizing high frequencies, typically up to a few GHz.

In the two fields of applications previously cited, it is standard practice to use a phase-locked loop (PLL) which comprises a VCO, a frequency divider which can be programmable and which is connected to the output of the oscillator to provide a divided frequency signal, and a phase comparator which delivers an error signal based on comparing the phases of the divided frequency signal and a reference signal. The amplified and then filtered error signal controls the oscillator VCO.

A first difficulty encountered in the prior art, when the required frequency is high, is that of providing a divide-by-N frequency divider which is needed to synthesize any frequency equal to k.N.Fr where k is a constant, N is a variable coefficient and Fr is the frequency of the reference signal. If N is an integer, frequencies multiple of the frequency Fr of the reference signal are generated by the oscillator VCO. However, it is routine practice not to limit N to integer values, which increases the complexity of the frequency divider included in the loop and leads to insurmountable technical implementation constraints at high frequencies.

A second difficulty results from the necessity to apply a very stable reference signal to the phase comparator; if this is not achieved, noise in the reference signal is multiplied by a factor k.N in the synthesized signal output by the oscillator.

OBJECT OF THE INVENTION

The main object of this invention is to overcome the aforementioned difficulties by providing a frequency control system which is based on comparing the frequencies of an incoming digital signal which has an unstable clock frequency and a clock signal generated directly or indirectly by an oscillator VCO and which is used both to extract the clock signal and for frequency synthesis, with the aim of tolerating variation in the frequency of the incoming signal about a mean value without any effect on the clock signal to be extracted or on the clock signal to be synthesized, whose frequency remains stable even in the presence of high jitter in the incoming signal.

SUMMARY OF THE INVENTION

Accordingly, a frequency control system comprising voltage-controlled oscillator means generating a clock signal, means receiving a digital incoming signal with unstable frequency for sampling the clock signal at two pairs of times corresponding to two consecutive transitions of the incoming signal in response to each of predetermined transitions of the incoming signal, the times of one pair being separated by a predetermined time-delay at most equal to half the period of the clock signal, to produce four state signals of the clock signal, a frequency comparator combining the four state signals to form an upcounting signal only when the frequency of the clock signal is substantially less than the frequency of the incoming signal and to form a downcounting signal only when the frequency of the clock signal is greater than the frequency of the incoming signal, and upcounting and downcounting means for respectively upcounting and downcounting predetermined transitions of the incoming signal in response to the upcounting signal and the downcounting signal in order to apply a control voltage depending on a content of the upcounting and downcounting means to the oscillatory means.

The frequency comparison in accordance with the invention is effected on the basis of two transitions of the incoming signal and not on one transition, as is generally the case in the prior art. The four state signals resulting from sampling the incoming signals at the two pairs of times for each transition can be combined by means for producing the upcounting signal for as long as three of the state signals corresponding to consecutive sampling times of the clock signal are identical, and means for producing the downcounting signal for as long as one of two state signals corresponding to sampling times of the clock signal lying between sampling times of the clock signal corresponding to the other two state signals is different from the other three state signals.

In a preferred embodiment of the invention, the functions of the aforementioned two producing means are implemented in the frequency comparator by means of a first EXCLUSIVE-OR gate receiving two state signals corresponding to sampling times of the clock signal between which are sampling times of the clock signal corresponding to the other two state signals, a second EXCLUSIVE-OR gate receiving the other two state signals, a first AND gate connected directly to the first EXCLUSIVE-OR gate and via an inverter to the second EXCLUSIVE-OR gate to produce said upcounting signal and a second AND gate connected directly to the second EXCLUSIVE-OR gate and via an inverter to the first EXCLUSIVE-OR gate to produce the downcounting signal.

The sampling means comprises preferably means for detecting predetermined transitions in the incoming signal in order to produce a transition signal and another transition signal delayed by the predetermined time-delay, and two pairs of flip-flops respectively producing the state signals. Each pair of flip-flops has a first flip-flop receiving the clock signal and a second flip-flop having an input connected to the direct output of the first flip-flop. The transition signal and the delayed transition signal are respectively applied to clock inputs of the pairs of flip-flops.

In particular, when the incoming signal is a clock signal with an unstable frequency, the sampling means is entirely digital. In this case, the transition detecting means comprises a divide-by-four frequency divider to produce a clock signal at half the frequency of the incoming signal, and means for selecting a transition of said incoming signal and a transition in the complementary signal of the incoming signal when it has been complemented, during one half-period in two of the half-frequency clock signal in order to produce the transition signal and the delayed transition signal, respectively.

When the frequency control system is used to extract a clock signal contained in an incoming digital data signal affected by noise, the system comprises means connected to the sampling means for comparing the phases of the incoming signal and the clock signal as a function of two of the four state signals in order to select from the clock signal and the complementary signal thereof an outgoing clock signal which is more in phase with the incoming signal and which is used to read the incoming signal. In this way, the outgoing clock signal is the recovered clock signal originally produced by the transmitter.

In a preferred embodiment of the invention, the phase comparing means comprises latch logic means connected to the sampling means for selecting from the clock signal and the complementary signal thereof an outgoing clock signal which is more in phase with the incoming signal when the state signals produced by the first or second flip-flops of said pairs of flip-flops are respectively at first and second states and at second and first states, and a flip-flop for reading the incoming signal as a function of the outgoing clock signal.

When the frequency control system is used to synthesize frequencies, it comprises divider means for generating the input signal to be applied to the sampling means in the form of an unstable reference clock signal having a mean frequency over a respective number of periods equal to a programmed frequency from a unit clock signal having a stable frequency not less than four times the programmed frequency, the ratio between the programmed frequency and the respective number of periods being constant.

The frequency of the unit clock signal is therefore more than four times the highest frequency that can be programmed in the programmable frequency divider.

The reference clock signal has a variable frequency resulting from programmed integer or non-integer division of the stable frequency of the unit clock signal, which is delivered by a quartz-crystal-controlled clock, for example. Variation of the reference signal frequency is inhibited in the control loop consisting essentially of the sampling means, the frequency comparator, the upcounting and downcounting means and the oscillator, with the result that the synthesized frequency produced by the oscillator is the required stable frequency, which is equal to a multiple of the mean reference clock frequency. In contrast to the prior art, the invention replaces the programmable frequency divider of prior art synthesis loops with a fixed frequency divider.

Frequency divider means comprises in a preferred embodiment of the invention an adder and a buffer register clocked at the frequency of the unit clock signal and storing a sum at outputs of the adder, wherein the adder adding the sum to the respective number associated with the programmed frequency.

To eliminate any distortion of the duty cycle of the reference clock signal, frequency divider means comprises a divide-by-two frequency divider receiving the most significant bit of the sum from the buffer register to generate the reference clock signal.

For the application to frequency synthesis in particular, oscillatory means comprises at least one voltage-controlled oscillator controlled by the upcounting and downcounting means via a loop filter, and a frequency divider for dividing the frequency of the signal generated by the oscillator by a fixed ratio in order to generate the clock signal. The fixed ratio is preferably a power of two. The loop filter filters in particular harmonics of the unit clock signal resulting from frequency division in the programmable frequency divider.

BRIEF DESCRIPTION OF THE DRAWINGS

The foregoing and other objects, features and advantages of the invention will be apparent from the following detailed description of several embodiments of the invention with reference to the corresponding accompanying drawings in which.

DESCRIPTION OF THE PREFERRED EMBODIMENTS

Figure 1:
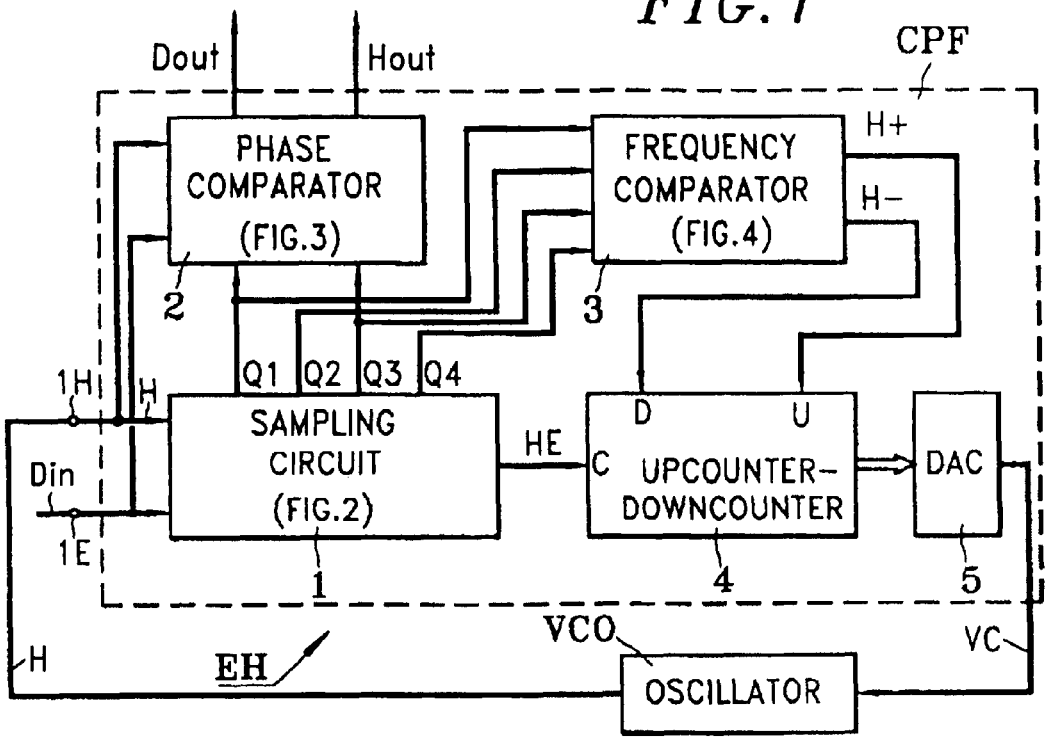
FIG. 1 is a schematic block diagram of a clock extractor circuit according to the invention.

Referring to FIG. 1, a frequency control system serving as a clock extractor circuit EH in telecommunication terminal or receiver includes a phase and frequency comparator CPF and a voltage-controlled oscillator VCO. The comparator CPF has two inputs to which are applied a digital incoming data signal Din, which is reshaped after transmission by a telecommunication transmitter, and a clock signal H supplied by the oscillator VCO. In the comparator CPF, comparing the phases of the signals Din and H produces an outgoing data signal Dout and an outgoing recovered clock signal Hout which are synchronized and in phase. Comparing the frequencies of the signals Din and H in the comparator CPF produces a variable voltage analog control signal VC for direct control of the oscillator VCO, in order to generate the clock signal H having a frequency set to the mean clock frequency of the data signal Din.

The phase is compared in the phase and frequency comparator CPF by means of a four-state sampling circuit 1 and a phase comparator 2 and the frequency is compared by means of sampling circuit 1, a frequency comparator 3, an upcounter-downcounter 4 and a digital-to-analog converter (DAC) 5.

Figure 2:
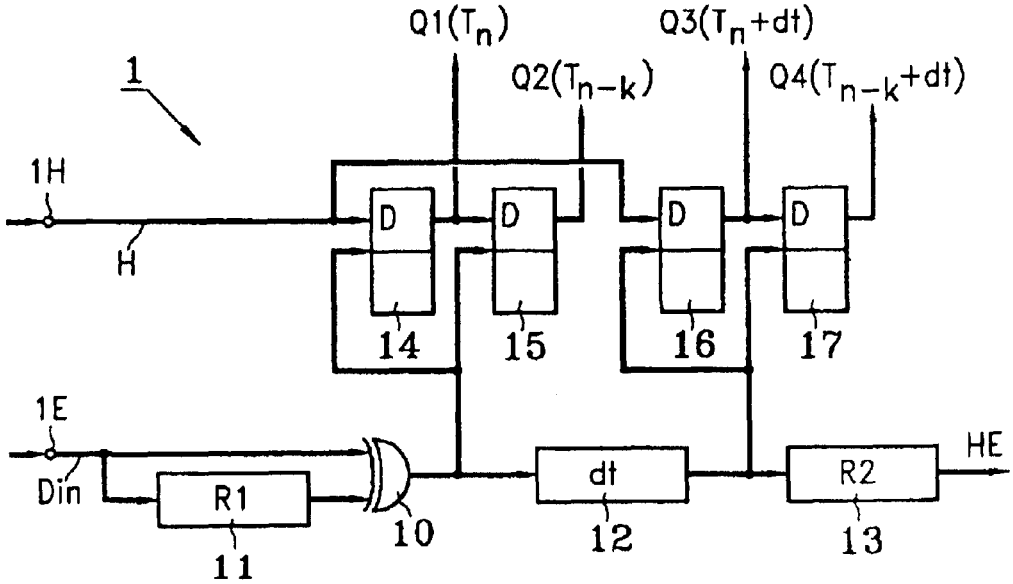
FIG. 2 shows in detail a sampling circuit included in the clock extractor circuit shown in FIG. 1.

Referring to FIG. 2, the sampling circuit 1 comprises an EXCLUSIVE-OR gate 10 having inputs connected to the input terminal 1E of the circuit EH for the data signal Din, both directly and via a delay line 11, and an output connected to two cascaded delay lines 12 and 13. The third delay line 13 supplies a sampling signal HE at a clock input C of the upcounter-downcounter 4. Via a clock signal input 1H of the sampling circuit 1, the clock signal H supplied by the oscillator VCO is applied to data inputs of first flip-flops 14 and 16 of two cascaded pairs of D-type flip-flops 14–15 and 16–17. The clock inputs of the flip-flops 14 and 15 of the first pair are connected to the output of the EXCLUSIVE-OR gate 10 and the clock inputs of the flip-flops 16 and 17 of the second pair are connected to the output of the second delay line 12. In each pair, the Q output of the first flip-flop 14, 16 is connected to the D input of the second flip-flop 15, 17. The Q outputs of the flip-flops 14 to 17 constitute respective outputs Q1 to Q4 of the four-state sampling circuit 1 respectively connected to four inputs of the frequency comparator 3. Only the outputs Q1 and Q3 of the first flip-flops 14 and 16 of the pairs in the sampling circuit are connected to two clock selection inputs of the phase comparator 2.

The sampling circuit 1 supplies to the phase comparator 2 and the frequency comparator 3 the state of the clock signal H produced by the oscillator VCO for each transition of the incoming data signal Din.

The rising and falling edges of the data signal Din are detected by the EXCLUSIVE-OR gate 10 and the first delay line 11, which imposes at one input of the gate 10 a short time-delay R1 relative to the nominal half-period of the incoming data signal Din which is applied directly to the other input of the gate 10. The time-delay R1 defines the width of the sampling pulses in the transition signal at the output of the EXCLUSIVE-OR gate 10. The sampling pulse supplied by the output of the gate 10 on each change of state of the data signal Din commands storing of the state of the clock signal H in the four D-type flip-flops 14 to 17.

As an alternative to this, instead of detecting the rising and falling edges of the signal Din, only the rising edges or only the falling edges are detected. For example, predetermined falling edges are detected by inserting an inverter on the output side of the delay line 11 and replacing the EXCLUSIVE-OR gate 10 with an AND gate.

The flip-flops 14 and 15 store the state of the signal H in response to a transition of the data signal Din at a time $T_n$ and at a time $T_{n-k}$ in response to the preceding transition of the signal Din, respectively. The integer k designates a variable number of unit bit periods or unit bit half-periods in the signal Din between two successive transitions. The flip-flops 16 and 17 also store two other states of the signal H, but subject to a predetermined time-delay Dt imposed by a transition signal delayed by the second delay line 12; thus the flip-flop 16 stores the state of the signal H at time $T_n$+dt and the flip-flop 17 stores the state of the signal H at time $T_{n-k}$+dt. The time-delay dt applied by the delay line 12 is at most equal to TH/2, where TH is the period of the clock signal H to be sampled.

The third delay line 13 imposes a time-delay R2 so that the sampling signal HE applied to a clock input of the upcounter-downcounter 4 is in phase with two logic signals H+ and H− supplied by the frequency comparator 3, these three signals HE, H+ and H− being applied to the upcounter-downcounter 4.

Each delay line can be implemented using a string of inverters.

Figure 3:
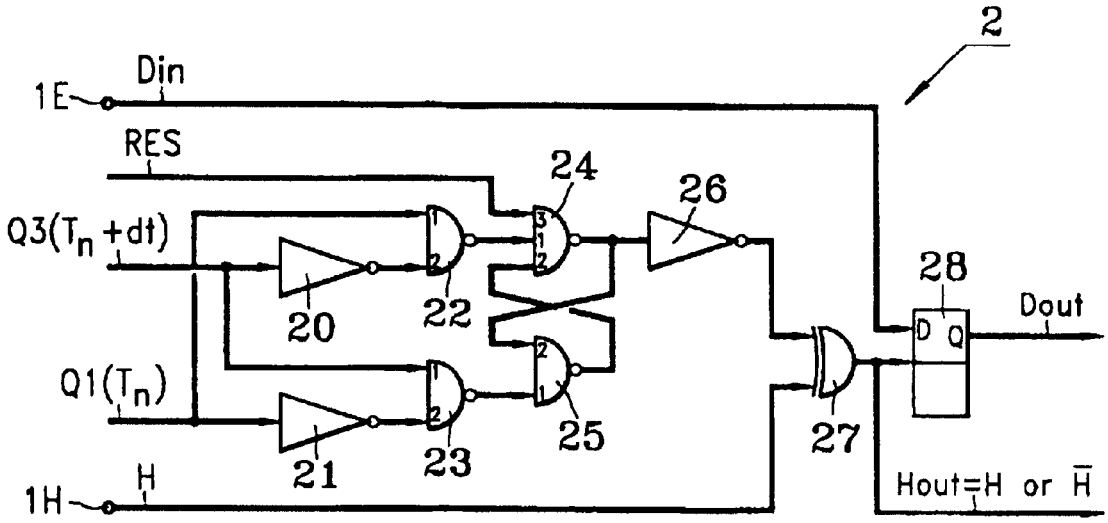
FIG. 3 shows in detail a phase comparator included in the clock extractor circuit shown in FIG. 1.

Referring to FIG. 3, the phase comparator 2 essentially comprises a latch comprising two inverters 20 and 21, two two-input NAND gates 22 and 23, a three-input NAND gate 24, a two-input NAND gate 25, an inverter 26, an EXCLUSIVE-OR gate 27 and a D-type flip-flop 28.

The output Q1 of the first flip-flop 14 of the sampling circuit 1 is connected directly to a first input of the NAND gate 22 and via the inverter 21 to a second input of the NAND gate 23. In a symmetrical manner, the output Q3 of the first flip-flop 16 of the second pair in the sampling circuit 1 is connected directly to a first input of the gate 23 and via the inverter 20 to a second input of the gate 22. As in an RS flip-flop, first inputs of the NAND gates 24 and 25 are respectively connected to the outputs of the gates 22 and 23 and second inputs of the gates 24 and 25 are connected to respective outputs of the gates 25 and 24. A reset input RES of the phase comparator 2 is connected to a third input of the NAND gate 24 and resets the phase comparator when the system EH is switched on by forcing the output of the gate 24 to "1". The output of the gate 24 is also connected via the inverter 26 to a first input of the EXCLUSIVE-OR gate 27, a second input of which receives the clock signal H from the oscillator VCO. The output of the gate 27 supplies the recovered clock signal Hout at the clock input of the flip-flop 28 The D input of the flip-flop 28 is the same as the input 1E of the sampling circuit 1 and receives the incoming data signal Din. The Q output of the flip-flop 28 supplies the data signal Dout in phase with the clock signal Hout.

For reading the incoming data signal Din, the phase comparator 2 chooses as the clock signal which is more in phase with the data signal Din, either the signal H or its complement H, given that the clock signal H is assumed to be at the "correct" frequency, i.e. synchronized with the mean frequency of the data signal Din by virtue of the processing carried out in the frequency comparator 3, which is described later. For this purpose, the latch 20–25 looks for an edge of the clock signal H during each time interval dt.

When Q1=0 and Q3=1, the first input of the NAND gate 24, i.e. The R input of the RS flip-flop 24–25, is at "1" and the signals H and Din are substantially in phase; the output of the gate 24 is set to "0" and the gate 27 selects the complemented signal H for reading the data signal Din in the flip-flop 28. Conversely, when Q1=1 and Q3=0, the first input of the NAND gate 25, i.e. the S input of the RS flip-flop 24–25, is at "1" and the signals H and Din are substantially in antiphase; the output of the gate 24 is set to "1" and the gate 27 selects the clock signal H for reading the data signal Din in the flip-flop 28. When Q1=Q3="0" or when Q1=Q3="1" the first inputs of the gates 24 and 25 are both at "1"; the preceding state of the output of the gate 24 is maintained, and the signal $\overline{H}$ or H previously selected by the gate 27 is retained. In this latter case, the choice remains correct even if the data signal Din contains jitter which has a maximum amplitude Gmax equal to TH/2−dt.

The logic states of the phase comparator 2 commented on below are summarized in the following truth table:

| Q1 | Q3 | Output 24 | Hout |
|---|---|---|---|
| 0 | 0 | unchanged | unchanged |
| 0 | 1 | 0 | $\overline{H}$ |
| 1 | 0 | 1 | H |
| 1 | 1 | unchanged | unchanged |

Alternatively, the inputs of the converters 20 and 21 respectively connected to the first inputs of the NAND gates 23 and 22 are connected to the outputs Q4 and Q2 of the sampling circuit instead of the outputs Q3 and Q1.

In the frequency comparator 3, the state of the clock signal H in a time interval dt is analyzed on two consecutive transitions $T_{n-k}$ and $T_n$ of the data signal Din, instead of on a transition $T_n$ as in the phase comparator 2. This analysis requires the four flip-flops 14 to 17 in the sampling circuit 1 to store, in response to each transition of the signal Din detected by the gate 10, the states Q2 and Q4 of the clock signal H at successive times $T_{n-k}$ and $T_{n-k}$+dt corresponding to a first transition preceding said each transition and the states Q1 and Q3 of the clock signal H at the successive times $T_n$ and $T_n$+dt corresponding to a second transition coincident with said each transition.

If three consecutive states out of four are identical, i.e. if $\overline{Q2}$=Q4=Q1=Q3 or Q2=Q4=Q1=$\overline{Q3}$, a period of the clock signal H is contained in a period of the data signal Din and the signal H is too fast, i.e. its phase is advanced relative to that of the data signal Din. If only one of the intermediate states Q4 and Q1 of the signal H at times $T_{n-k}$+dt and $T_n$ is different from the other three, i.e. if Q2=$\overline{Q4}$=Q1=Q3 or Q2=Q4=$\overline{Q1}$=Q3, the period of the signal H is greater than that of the signal Din and the signal H is too slow, i.e. the phase of the signal H lags that of the data signal Din. In contrast, if the states Q1 and Q3 are identical and the states Q2 and Q4 are identical, or if the states Q1 and Q3 are different and the states Q2 and Q4 are different, the signals H and Din are substantially at the same frequency, in phase or in phase-quadrature, or exceptionally at very different frequencies (out of band).

For example, if at times $T_{n-k}$ and $T_{n-k}$+dt the signal H is such that Q2="0" and Q4="1" and if at subsequent times $T_n$ and $T_n$+dt the signal H is such that Q1="1" and Q3="1" respectively, the frequency comparator 3 deduces that the signal H is too fast.

The truth table for the frequency comparator 3 is then as follows:

| $T_n$ Q1 | $T_n$ + dt Q3 | $T_{n-k}$ Q2 | $T_{n-k}$ + dt Q4 | Decision | H− | H+ |
|---|---|---|---|---|---|---|
| 0 | 0 | 1 | 0 | H too fast | 1 | 0 |
| 0 | 0 | 0 | 1 | H too slow | 0 | 1 |
| 0 | 0 | 0 | 0 | no correction | 0 | 0 |
| 0 | 0 | 1 | 1 | no correction | 0 | 0 |
| 0 | 1 | 1 | 1 | H too slow | 0 | 1 |
| 0 | 1 | 0 | 0 | H too fast | 1 | 0 |
| 0 | 1 | 0 | 1 | no correction | 0 | 0 |
| 0 | 1 | 1 | 0 | H out of band | 0 | 0 |
| 1 | 0 | 1 | 1 | H too fast | 1 | 0 |
| 1 | 0 | 0 | 0 | H too slow | 0 | 1 |
| 1 | 0 | 1 | 0 | no correction | 0 | 0 |
| 1 | 0 | 0 | 1 | H out of band | 0 | 0 |
| 1 | 1 | 1 | 0 | H too slow | 0 | 1 |
| 1 | 1 | 0 | 1 | H too fast | 1 | 0 |
| 1 | 1 | 1 | 1 | no correction | 0 | 0 |
| 1 | 1 | 0 | 0 | no correction | 0 | 0 |

In the above table, the "out of band" decision signifies that the received data signal Din is at much too high or too low a frequency outside the lock-on band of the oscillator VCO or contains non-conform jitter. In this case, it is preferable for a logic circuit (not shown) implementing the logic function ($\overline{Q1}$.Q3.Q2.$\overline{Q4}$+Q1.$\overline{Q3}$.$\overline{Q2}$.Q4) and connected to the four outputs Q1 to Q4 of the sampling circuit 1 to produce an error signal.

The above truth table satisfies the following logic equations:

$$H+=(Q1.\overline{Q4}+\overline{Q1}.Q4)(Q2.Q3+\overline{Q2}.\overline{Q3})$$

$$H-=(Q2.\overline{Q3}+\overline{Q2}.Q3)(Q1.Q4+\overline{Q1}.\overline{Q4})$$

Figure 4:
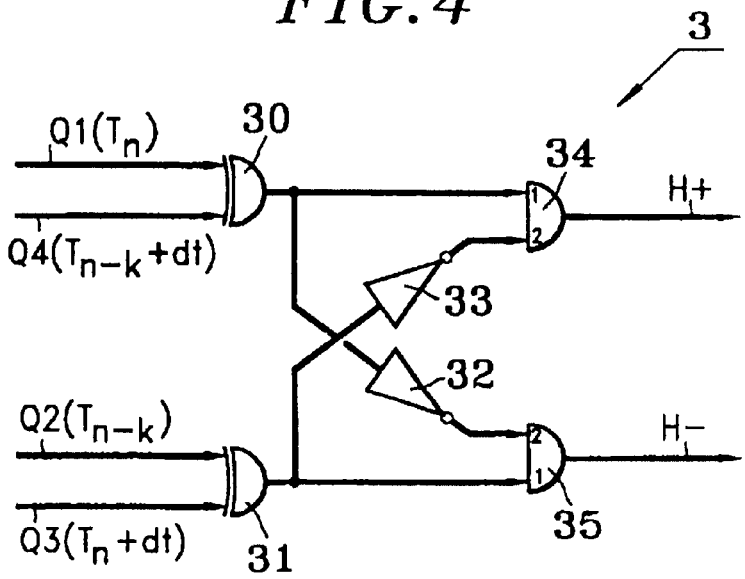
FIG. 4 shows in detail a frequency comparator included in the clock extractor circuit shown in FIG. 1.

In conformance with the above two logic equations, the frequency comparator 3 shown in FIG. 4 includes two EXCLUSIVE-OR gates 30 and 31, two inverters 32 and 33 and two two-input AND gates 34 and 35. The outputs Q1 and Q4 of the sampling circuit 1 are connected to the inputs of the gate 30, and the outputs Q2 and Q3 of the sampling circuit 1 are connected to the inputs of the gate 31. The output of the gate 30 is connected directly to a first input of the gate 34 and via the inverter 32 to a second input of the gate 35. Symmetrically, the output of the gate 31 is connected directly to a first input of the gate 35 and via the inverter 33 to a second input of the gate 34. The outputs of the gates 34 and 35 supply the logic signals H+ and H−, respectively.

Accordingly, the frequency comparator 3 analyzes the sense of the timing error between the incoming data signal Din and the clock signal H from the oscillator VCO. The sense of this error is represented by the states of the logic signals H+ and H− which are respectively applied to an upcounting input U and a downcounting input D of the upcounter-downcounter 4.

For as long as it is at "1", the upcounting logic signal H+ sets the upcounter-downcounter 4 to the upcounting mode so that each pulse of the sampling signal HE increments the upcounter-downcounter by one unit and thereby increases the control voltage VC of the oscillator VCO to increase the frequency of the clock signal H, which was too slow. Conversely, for as long as it is at "1", the downcounting logic signal H− sets the upcounter-downcounter 4 to the downcounting mode so that each pulse of the sampling signal HE decrements the upcounter-downcounter by one unit and thereby decreases the control voltage VC of the oscillator VCO to decrease the frequency of the clock signal H, which was too fast. Thus the upcounter-downcounter thus "smoothes" fluctuations in the clock frequency of the incoming signal so that in the long term and on average the oscillator VCO operates at the mean frequency of this clock frequency. The digital-to-analog converter 5 converts the variable digital content of the upcounter-downcounter 4 into the control voltage VC applied to the control input of the oscillator VCO.

The capacity of the upcounter-downcounter 4 depends on the precision required of the frequency produced by the oscillator VCO.

If the data signal Din is subject to jitter, the amplitude of the jitter can reach the peak value Gmax such that Gmax= TD/2−dt, where TD is the period corresponding to the bit rate of the incoming data signal Din.

Figure 5:
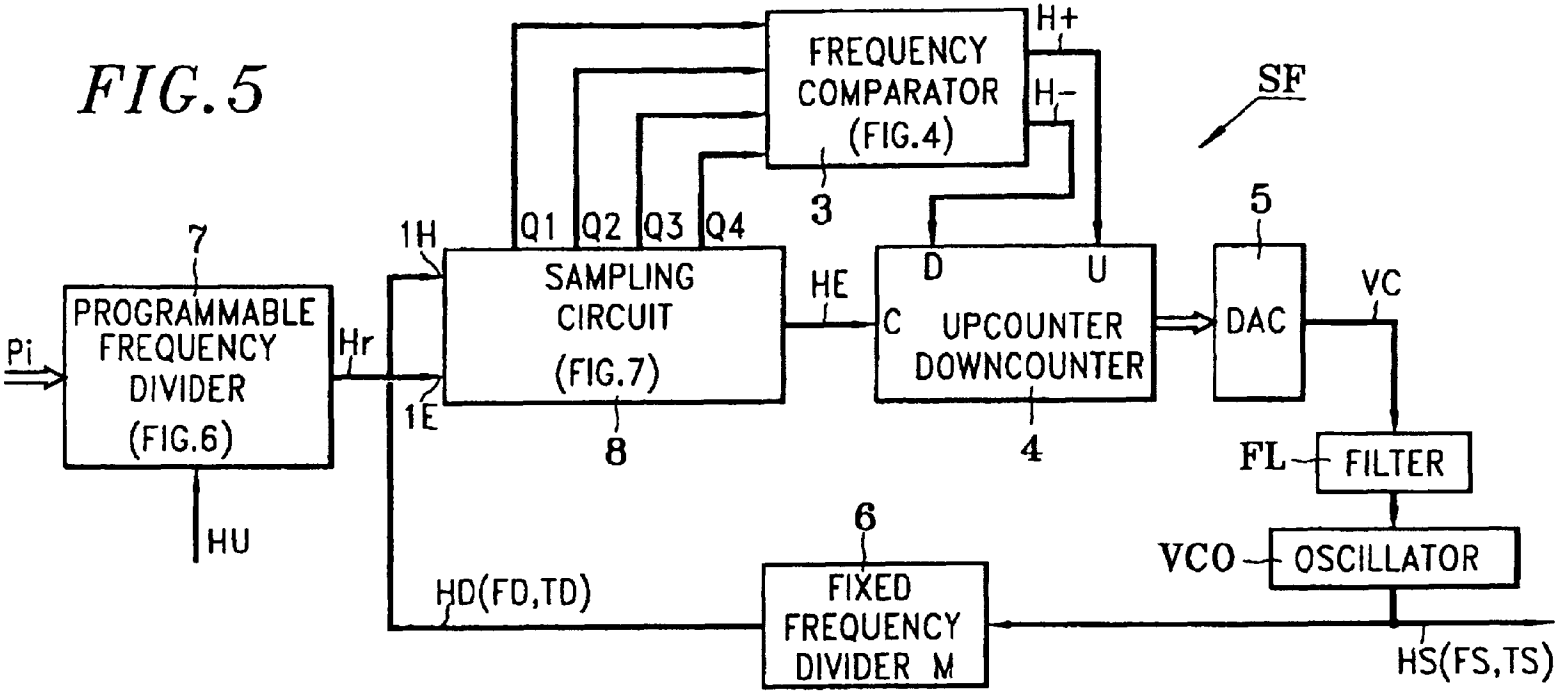
FIG. 5 is a block diagram of a frequency synthesizer according to the invention.

A second embodiment of the frequency control system according to the invention is a frequency synthesizer SF as shown in FIG. 5. The synthesizer includes a sampling circuit 8 which is preferably modified compared to the sampling circuit 1, in the manner explained hereinafter, the frequency comparator 3, the upcounter-downcounter 4, the digital-to-analog converter 5, a low-pass loop filter FL and the voltage-controlled oscillator VCO. A fixed frequency divider 6 connects the output of the oscillator VCO, which produces a synthesized clock signal HS, to the clock signal input 1H of the sampling circuit 8. The divider 6 divides the frequency of the synthesized signal HS by an integer ratio M to produce a divided clock signal HD.

The frequency synthesizer SF therefore uses loop circuits for the frequency comparison, like the clock extractor circuit EH.

The frequency synthesizer SF also comprises a programmable frequency divider 7 for applying a reference clock signal Hr at a programmable frequency to the incoming data signal input 1E of the sampling circuit 8.

The frequency FS of the clock signal HS from the oscillator VCO is divided by the fixed integer ratio M in the frequency divider 6 of the frequency synthesizer SF. M is an integer and is preferably a power of 2. If Fr denotes the frequency of the reference clock signal Fr, FS is equal to Fr.M when the oscillator VCO is operating under steady state conditions.

To obtain a set of I ordered frequencies FS1, . . . FSi, . . . FSI with an integer index i such that $1 \leqq i \leqq I$ and FSi<FS(i+1), it is necessary to synthesize the same number of frequencies Fr1, . . . Fri, . . . FrI of reference signals Hr1, . . . Hri, . . . HrI, with Fri<Fr(i+1). To synthesize the reference frequencies precisely using a prior art frequency divider which includes a binary counter, it would be necessary to control that divider with a clock signal whose frequency would be equal to the lowest common multiple (LCM) of the frequencies Fr1, . . . Fri, . . . FrI, which is almost impossible to achieve, in particular if the integer I is large and the frequencies Fr1 to FrI are high.

The frequency synthesizer SF according to the invention is based on the hypothesis that the reference frequencies Fr1, . . . Fri, . . . FrI have an integer highest common factor (HCF) p such that P1=Fri/p, . . . Pi=Fri/p, . . . PI=FrI/p are integers, and computes the period Tri of the required reference signal Hri as a function of the selected number Pi. Let TU denote a period unit for computing the period of the selected reference signal such that $TU \leqq TrI=1/FrI$, and FB=Fr1, the lowest synthesizable frequency obtained for P1=1. The period TB corresponding to the frequency FB contains the greatest number of period units TU of all the periods corresponding to the reference frequencies Fr1 to FrI; let N denote the aforementioned integer number. The following equations can then be deduced:

TB=N.TU=1/p frequency unit FU=1/TU=p.N, and the period of the selected reference signal Tri=1/Fri=TU.N/Pi.

As a result, computing the period Tri of the reference signal Hri amounts to computing how many times the number Pi is contained in the number N. For this, the invention proposes to add the number Pi to itself at the timing rate TU until the number N is obtained and on each computation to produce a sample at "0" if the computation result is less than N/2 and a sample with value "1" otherwise.

However, the number Pi associated with the frequency Fri of the reference signal Hri to be synthesized is not necessarily an integer factor of the integer N after the computation. Let $r_1, r_2, r_3, \ldots r_{Pi}$ denote overflows less than Pi occurring in the last period unit TU for the first period Tri, then for the second period Tri succeeding the first period, then for the third period Tri succeeding the second period, and so on, up to the (Pi)th period. The successive "periods" Tri are written:

| | |
|---|---|
| first period | Tri: $T_1 = TU(N + r_1)/Pi$; |
| second period | Tri: $T_2 = TU(N - r_1 + r_2)/Pi$; |
| third period | Tri: $T_3 = TU(N - r_2 + r_3)/Pi$; |
| Pth period | Tri: $T_{Pi} = TU(N - r_{Pi-1} + r_{Pi})/Pi$, |

the numbers $(N+r_1)$, $(N-r_1+r_2)$, $(N-r_2+r_3)$, . . . , $(N-r_{Pi-1}+r_{Pi})$ being integer multiples of Pi. The last overflow rPi is equal to zero since the sum of the latter numbers $NPi=r_{Pi}$ is a multiple of Pi.

The sum of Pi consecutive synthesized periods Tri is therefore equal to N.TU and the mean period generated over the duration N.TU is equal to:

$$\text{Mean of Tri}=\overline{\text{Tri}}=TU.N/Pi.$$

The mean of the periods generated by the synthesizer is indeed equal to the required value Tri. The generated signal is frequency-modulated because a period Tri is generated to within TU in each computation cycle that corresponds to the first, second, third, . . . or Pth period Tri. The maximum amplitude of the jitter is therefore equal to TU. As indicated hereinafter, the frequency comparator 3 allows a maximum jitter equal to the half-period of the reference signal Hr applied to the input 1E of the sampling circuit 8. The inegality $TU \leqq TrI/2$ must be respective, TrI being the smallest period of the set of periods Tr1 to TrI; thus the condition for the synthesizer to function is $FU \geqq 2.FrI$.

Furthermore, the signal generated by the cyclic additions does not have a duty cycle equal to 0.5. It is necessary to divide the frequency of this signal by two to eliminate the distortion of the duty cycle; this condition is complied with by applying the conditions $FU \geqq 2.FrI=4.Fr$.

Figure 6:
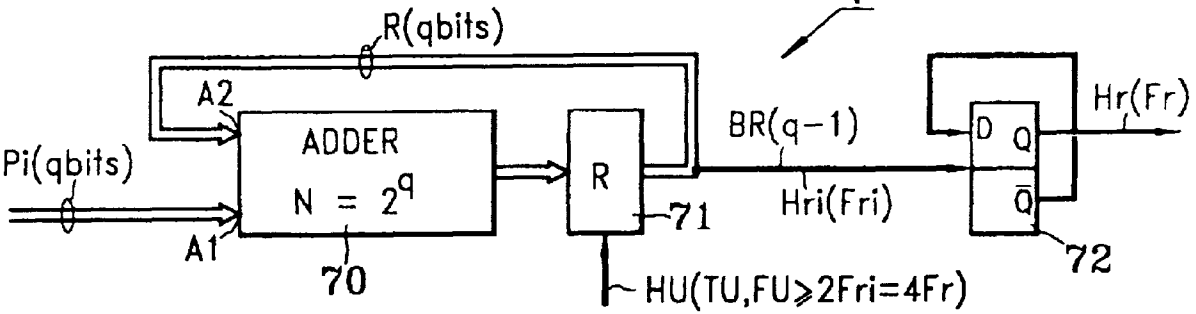
FIG. 6 shows in detail a programmable frequency divider included in the frequency synthesizer shown in FIG. 5.

FIG. 6 shows the programmable frequency divider 7 having the functional characteristics explained hereinabove. It comprises an adder 70 having two input ports A1 and A2, a buffer register 71 and a divide-by-2 frequency divider including a flip-flop 72. The adder 70 preferably has a capacity which is a power of 2, i.e. $N=2^q$, and receives on first inputs A1 the integer Pi coded on q bits for programming the frequency Fri to be synthesized and adds the integer Pi to a result R coded on q bits applied to the second inputs A2 thereof via the register 71. The register 71 has an input port connected to the output port of the adder 70, its q outputs connected to the second input port A2 of the adder and its most significant bit output BR(q−1) connected to the clock input of the flip-flop 72. The register 71 is clocked by a clock signal HU having a frequency greater than 4.Fr. The clock signal HU is stable and is generated by a quartz-crystal-controlled clock, typically operating at a frequency of a few megahertz, constituting a very low noise source of pure frequency. The flip-flop 72 forms a divide-by-2 frequency divider and has a complimentary output $\overline{Q}$ connected to its input D and supplies the selected reference clock signal Hr at an output Q.

The reference signal Hr is frequency-modulated because it is generated in the programmable frequency divider 7 in which the programmed frequency Fri is obtained on average only every Pi periods Tri=1/Fri. Despite variations of the reference signal Hr, the frequency control loop including the frequency comparator 3 and shown in FIG. 5 stabilizes the programmed frequency FS in the clock signal HS delivered by the oscillator VCO at the required mean value of the frequency Fr=Fri/2 at the reference signal. Periodic variations of the frequency of the reference signal therefore have no effect on the frequency FS at the output of the synthesizer SF of the invention.

Referring again to FIG. 6, the binary word Pi on q bits and the cumulative result R delivered by the register 71, which registers the word leaving the adder at the timing rate of the frequency unit FU of the period unit signal TU, are therefore added cyclically to the frequency FU. The programmable frequency divider 7 does not include any digital comparator to determine the frequency Fri of the clock signal Hri by comparing R and N prior to division by 2 in the flip-flop 72. The invention utilizes the state of the most significant bit BR(q−1) of the result word R at the output of the register 71 to form the signal Hri, BR(0) being the least significant bit of the word R. If the result R is less than N/2, then BR(q−1) is equal to "0"; otherwise BR(q−1) is equal to "1"; the reference clock signal Hr is then produced by the Q output of the flip-flop 72 by halving the frequency of the most significant bit signal BR(q−1).

To summarize, the equations of the programmable frequency divider are as follows:

$FU_{min}$=2.FrI $N_{min}=FU_{min}/p$,

N being preferably as $N=2^q>N_{min}$;

FU=p.N

Tri=TU.N/Pi=1/(p.Pi)

Fri=p.Pi.

A numerical example is given below. Consider an oscillator VCO which must generate frequencies FS equal to 1200, 1250, 1300, 1350 and 1400 MHz. Knowing that the divider 6 of the synthesizer loop has a fixed division ratio M equal to 1024, the frequencies of the reference signal Fr to be synthesized are equal to 1.171875; 1.220703125; 1.26953125; 1.318359375 et 1.3671875 MHz. Given the division by 2 in the flip-flop 72 to obtain the reference clock signal Hr at the output of the divider 7, the frequencies to be generated are as follows:

Fr1=2.34374; 2.44140625; 2.5390625; 2.63671875 et FrI=Fr5=2.734375 MHz. The pitch p of the synthesizer is equal to 0.09765625 MHz, $FU_{min}$ equal to 2(2.734375) MHz=5.468875 MHz et $N_{min}$ equal to $FU_{min}$/P=56.

From this it can be deduced that:

$N=2^6=64$ et q=6

HQ=N.p=6.25 MHz

P1=24; P2=25; P3=26; P4=27; P5=28.

For example, for Pi=26 the reference frequency is Fr=Fri/2=p.Pi/2=1.26953125 MHz.

In the sampling circuit 8 of the frequency synthesizer SF, the periodic reference signal Hr is applied to the input 1E for the data signal Din, and the clock signal HD from the divide-by-M frequency divider 6 connected to the oscillator VCO is applied to the input 1H. Fr is the frequency of the clock signal Hr sampling the signal HD having the frequency FD after division by M of the frequency HS of the synthesized clock signal FS. The equation Fr=2.FD=2(FS/K) then applies, i.e. FS=Fr(K/2).

Figure 7:
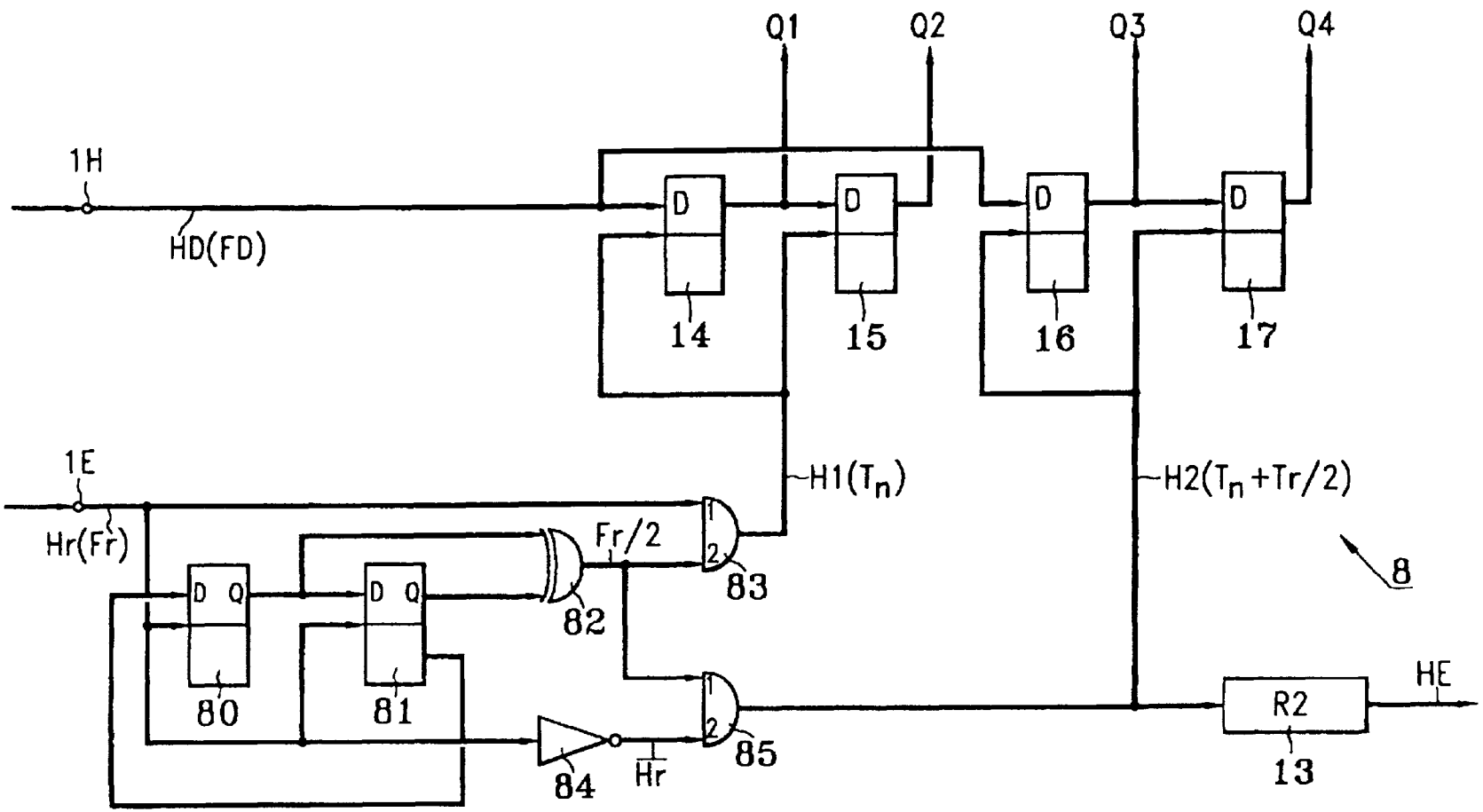
FIG. 7 shows in detail a sampling circuit included in the frequency synthesizer shown in FIG. 5.

In a preferred embodiment of the invention shown in FIG. 7, the sampling circuit 8 comprises digital means for producing a transition signal H1 and a delayed transition signal H2 delayed by a delay dt for sampling the clock signal HD applied to the input 1H. Like the sampling circuit 1, the sampling circuit 8 comprises the delay line 13 and the two pairs of flip-flops 14–15 and 16–17, and entirely digital means 80–85 instead of the delay lines 11 and 12 and the EXCLUSIVE-OR gate 10 in circuit 1 (FIG. 2). The digital means are downstream of the input 1E which receives the reference clock signal Hr supplied by the programmable frequency divider 5, i.e. which receives, after division by 2, one of the clock signals Tr1 to TrI selected according to the integer Pi coded on q bits supplied to the first input A1 of the adder 70 (FIG. 6), and produce the clock signals H1 and H2 at the clock inputs of the pairs of flip-flops 14–15 and 16–17, respectively.

The digital means 80–85 use a frequency Fr higher than those of the transition signals H1 and H2 used for sampling and divide the frequency Fr to obtain the correct frequency FD at the clock inputs of the sampling flip-flops 14 to 17. This division provides perfect control of the time-delay dt.

Because the programmable frequency divider 7 delivers the reference signal Hr with a maximum jitter equal to Tr/2, to absorb this jitter the time-delay dt must be such that:

dt=TD/4−Tr/2 where TD is the period of the clock signal at the input 1H.

Because the period TD is obtained from the period Tr of the reference signal Hr by integer division by M, the following equation applies:

TD=M.Tr, from which the time-delay is deduced:

dt=M.Tr/4−Tr/2.

For the smallest time-delay dt=Tr/2 which can be obtained in a digital circuit from a signal of period Tr, the optimum solution deduced from the above equation is M=4.

In the embodiment of the invention shown in FIG. 7 the aforementioned digital means 80–85 include a divide-by-4 frequency divider comprising two D-type flip-flops 80 and 81 and a logic circuit including an EXCLUSIVE-OR gate 82, two two-input AND gates 83 and 85, and an inverter 84 for producing the two transition signals H1 and H2 at the frequency FD=Fr/2. The clock inputs of the flip-flops 80 and 81, a first input of the AND gate 83 and the input of the inverter 84 receive the clock signal Hr. The flip-flops 80 and 81 forming a divide-by-4 frequency divider, the complemented output Q of the second flip-flop 81 is connected to the D input of the first flip-flop 80 The outputs Q of the flip-flops 80 and 81 produce two logic signals at the frequency Fr/4 phase shifted by 2Tr and are connected to respective inputs of the EXCLUSIVE-OR gate 82 The output of the gate 82 therefore produces a signal at the frequency Fr/2 and is connected to a second input of the AND gate 83 and to a first input of the AND gate 85, which has a second input connected to the output of the inverter 84 The pulses of width Tr of the signal of period 2Tr at the output of the EXCLUSIVE-OR gate 82 select one in two periods of the signal Hr in the AND gate 83 to constitute the transition signal H1 of width Tr/2 and of period 2Tr applied to the clock inputs of the flip-flops 14 and 15 of the first pair. The pulses of the signal at the output of the gate 82 select one in two periods of the complementary signal $\overline{Hr}$ in the AND gate 85 to constitute the transition signal H2 which is identical to the signal H1 but with a time-delay of dt=Tr/2 relative thereto and is applied to the clock inputs of the flip-flops 16 and 17 of the second pair, as well as to that of the delay line 13, which supplies the sampling signal HE applied to the clock input of the upcounter-downcounter 4.

The two clock signals H1 and H2 sample the signal HD from the oscillator VCO after division by M at times $T_n$ and $T_n$+Tr/2.

What is claimed is:

1. A frequency control system comprising:

voltage-controlled oscillator means for generating a clock signal[.];

means for receiving a digital incoming signal with unstable frequency for sampling said clock signal at two pairs of times corresponding to two consecutive transitions of said incoming signal in response to each of predetermined transitions of said incoming signal, said times of one pair being separated by a predetermined time-delay at most equal to half the period of said clock signal, to produce four state signals of said clock signal[.];

a frequency comparator for combining said four state signals to form an upcounting signal only in response to the frequency of said clock signal being substantially less than the frequency of said incoming signal and to form a downcounting signal only in response to the frequency of said clock signal being greater than the frequency of said incoming signal[.]; and upcounting and downcounting means for respectively upcounting and downcounting predetermined transitions of said incoming signal in response to said upcounting signal and said downcounting signal for applying a control voltage dependent on a content of said upcounting and downcounting means to said oscillator means via a digital-to-analog converter.

2. The system claimed in claim 1 wherein said frequency comparator includes a first EXCLUSIVE-OR gate for receiving two state signals corresponding to sampling times of said clock signal between which are sampling times of said clock signal corresponding to the other two state signals, a second EXCLUSIVE-OR gate for receiving said other two state signals, a first AND gate connected directly to said first EXCLUSIVE-OR gate and via an inverter to said second EXCLUSIVE-OR gate to produce said upcounting signal and a second AND gate connected directly to said second EXCLUSIVE-OR gate and via an inverter to said first EXCLUSIVE-OR gate to produce said downcounting signal.

3. The system claimed in claim 1 wherein said sampling means include means for detecting said predetermined transitions in said incoming signal for producing a transition signal and another transition signal delayed by said predetermined time-delay, and two pairs of flip-flop for respectively producing said state signals and each having a first flip-flop for receiving said clock signal and a second flip-flop having an input connected to the direct output of said first flip-flop, said transition signal and said delayed transition signal being arranged to be respectively applied to clock inputs of said pairs of flip-flops.

4. The system claimed in claim 3 wherein said transitions detecting means are digital means and comprises a divide-by-four frequency divider for producing a clock signal at half the frequency of said incoming signal, and means for selecting a transition of said incoming signal and a transition in the complementary signal of said incoming signal when it has been complemented, during one half-period in two of said half-frequency clock signal in order to produce said transition signal and said delayed transition signal, respectively.

5. The system claimed in claim 3, further comprising latch means connected to said sampling means for selecting from said clock signal and the complementary signal thereof an outgoing clock signal which is more in phase with said incoming signal when said state signals produced by two flip-flops of said pairs of flip-flops are respectively at first and second states and at second and first states, and a flip-flop for reading said incoming signal as a function of said outgoing clock signal.

6. A system as claimed in claim 1, further comprising means connected to said sampling means for comparing the phases of said incoming signal and said clock signal as a function of two of said four state signals in order to select from said clock signal and the complementary signal thereof an outgoing clock signal which is more in phase with said incoming signal and which is used to read said incoming signal.

7. A system as claimed in claim 1, further comprising programmable frequency divider means for generating said incoming signal to be applied to said sampling means in the form of an unstable reference clock signal having a mean frequency over a respective number of periods equal to a programmed frequency from a unit clock signal having a stable frequency not less than four times the programmed frequency, the ratio between said programmed frequency and said respective number of periods being constant.

8. The system claimed in claim 7 wherein said programmable frequency divider means comprises an adder and a buffer register clocked at the frequency of said unit clock signal and for storing a sum at outputs of said adder, and said adder being arranged to add said sum to the respective number associated with said programmed frequency.

9. The system claimed in claim 8 wherein said frequency divider means comprises a divide-by-two frequency divider for receiving a most significant bit of said sum from said buffer register to generate said reference clock signal.

10. The system claimed in claim 1 wherein said oscillatory means comprises at least one voltage-controlled oscillator arranged to be controlled by said upcounting and downcounting means via a loop filter, and a frequency divider for dividing the frequency of the signal generated by said oscillator by a fixed ratio in order to generate said clock signal.

11. The system claimed in claim 1 wherein said frequency comparator satisfies the following logic equations:

$$H+=(Q1.\overline{Q4}+\overline{Q1}.Q4)(Q2.Q3+\overline{Q2}.\overline{Q3})$$

$$H-=(Q2.\overline{Q3}+\overline{Q2}.Q3)(Q1.Q4+\overline{Q1}.\overline{Q4})$$

Q1, Q2, Q3 and Q4 being said four state signals and $\overline{Q1}$, $\overline{Q2}$, $\overline{Q3}$ and $\overline{Q4}$ being complement signals thereof.

12. A frequency control [signals] *system* comprising:

a voltage-controlled oscillator for generating a clock signal[,];

a sampler for receiving a digital input signal having an unstable frequency and for sampling said clock signal at two pairs of times corresponding to two consecutive transitions of said digital *input* signal, the sampler [in response to] being arranged to derive four state signals of said clock signal *in response to* predetermined transitions of said *digital* input signal, said times of one pair being separated by a predetermined time-delay at most equal to half the period of said clock signal[,];

a frequency comparator for combining said four state signals to form an upcounting signal only in response to the frequency of said clock signal being substantially less than the frequency of said *digital* input signal and to form a downcounting signal only in response to the frequency of said clock signal being greater than the frequency of said [incoming] *digital input* signal[,]; [and]

a counter for respectively upcounting and downcounting predetermined transitions of said *digital* input signal in response to said upcounting signal and said downcounting signal[,]; and a converter responsive to the counter for deriving a control voltage dependent on the count of said counter, the oscillator being arranged to be responsive to the control voltage.

13. A system as claimed in claim 12, further comprising a phase comparator connected to said sampler for comparing the phases of said incoming signal and said clock signal as a function of two of said four state signals for selecting from said clock signal and the complementa[t]ry signal thereof an outgoing clock signal which is more in phase with said incoming signal and for reading said incoming signal.

*14. A system comprising:*

*a frequency comparator;*

*a sampling circuit configured to receive a clock signal and a digital input signal and to output at least four sample values to the frequency comparator in response to each transition of a plurality of transitions of the digital input signal, wherein each of said sample values is a sample of the clock signal;*

*a counter configured to change a count value in response to transitions of said plurality of transitions, wherein the frequency comparator is configured to operate on said sample values in order to generate one or more control signals that determine whether the counter increases or decreases the count value in response to a transition of said plurality of transitions;*

*a voltage-controlled oscillator configured to generate the clock signal with a frequency determined by the count value.*

*15. The system of claim 14, wherein a first pair of said sample values are separated by a time delay equal at most to half a period of said clock signal.*

*16. The system of claim 14, wherein the control signals include an upcounting signal and a downcounting signal, wherein the frequency comparator is configured to (a) assert the upcounting signal in response to said sample values indicating that the frequency of said clock signal is substantially less than a frequency associated with said digital input signal and (b) assert the downcounting signal in response to said sample values indicating that the frequency of said clock signal is substantially greater than the frequency associated with said digital input signal.*

*17. The system of claim 16, wherein the counter is configured to increase the count value in response to a transisiton of said plurality of transitions if the upcounting signal is asserted and to decrease the count value in response to the transition if the downcounting signal is asserted.*

*18. The system of claim 14 further comprising a converter configured to generate a control voltage in response to the count value, wherein the voltage controlled oscillator is configured to receive the control voltage, wherein the control voltage determines the frequency of the clock signal generated by the voltage controlled oscillator.*

*19. The system of claim 14, wherein said plurality of transitions are rising-edge transitions of the digital input signal.*

*20. The system of claim 14, wherein said plurality of transitions are falling-edge transitions of the digital input signal.*

*21. The system of claim 14, wherein said plurality of transitions include rising-edge transitions and falling-edge transitions of the digital input signal.*

*22. The system of claim 14, wherein two of said at least four sample values are captured from said clock signal in response to a current transition of said plurality of transitions, wherein remaining ones of said at least four sample values were captured from said clock signal in response to one or more previous transitions of said plurality of transitions.*

*23. The system of claim 14, wherein the sampling circuit includes:*

*two cascaded pairs of flip-flops configured to output the four sample values, wherein a first flip-flop of each pair is configured to receive the clock signal;*

*a subcircuit configured to receive the digital input signal and to assert a pulse in response to each transition of said plurality of transitions of the digital input signal;*

*wherein a first of the two cascaded pairs is clocked by the pulse, wherein a second of the two cascaded pairs is clocked by a delayed version of the pulse.*

*24. A system comprising:*

*a frequency comparator;*

*a sampling circuit configured to receive a first clock signal and a digital input signal and to output at least four sample values to the frequency comparator in response to each transition of a plurality of transitions of the digital input signal, wherein each of said sample values is a sample of the first clock signal;*

*a counter configured to change a count value in response to transitions of said plurality of transitions, wherein the frequency comparator is configured to operate on said sample values in order to generate one or more control signals that determine whether the counter increases or decreases the count value in response to a transition of said plurality of transitions;*

*a voltage-controlled oscillator configured to generate a second clock signal with a frequency determined by the count value, wherein the first clock signal has a frequency dependent on the frequency of the second clock signal.*

*25. The system of claim 24 further comprising a frequency divider configured to receive the second clock signal and generate the first clock signal from the second clock signal.*

*26. The system of claim 24, wherein said plurality of transitions are rising-edge transitions of the digital input signal.*

*27. The system of claim 24, wherein said plurality of transitions are falling-edge transitions of the digital input signal.*

*28. The system of claim 24, wherein said plurality of transitions include rising-edge transitions and falling-edge transitions of the digital input signal.*

*29. The system of claim 24, wherein two of said at least four sample values are captured from said first clock signal in response to a current transition of said plurality of transitions, wherein remaining ones of said at least four sample values were captured from said first clock signal in response to one or more previous transitions of said plurality of transitions.*

*30. The system of claim 24, wherein the sampling circuit includes:*

*two cascaded pairs of flip-flops configured to output the four sample values, wherein a first flip-flop of each pair is configured to receive the first clock signal;*

*a subcircuit configured to receive the digital input signal and to assert a first pulse and a second pulse in response to each transition of said plurality of transitions of the digital input signal, wherein the second pulse is delayed relative to the first pulse;*

*wherein a first of the two cascaded pairs is clocked by the pulse, wherein a second of the two cascaded pairs is clocked by the second pulse.*

*31. The system of claim 24 further comprising:*

*a programmable frequency divider configured to generate the digital input signal with a programmable frequency, wherein the programmable frequency divider includes an adder, a register and a flip-flop, wherein the adder is configured to receive a programmably-selected integer value at its first input and to receive an output of the register at its second input, wherein the register is configured to receive an output of the adder, wherein the register is configured to receive a clock signal HU at its clock input, wherein a most significant bit of the register output is coupled to a clock input of the flip-flop, wherein an output of the flip-flop is coupled to a data input of the flip-flop.*

*32. A method comprising:*

*receiving a clock signal and a digital input signal;*

*outputting at least four sample values in response to each transition of a plurality of transitions of the digital input signal, wherein each of said sample values is a sample of the clock signal;*

*changing a count value in response to transitions of said plurality of transitions;*

*operating on said at least four sample values outputted in response to each transition of said plurality of transi-*

*tions in order to generate one or more control signals that determine whether the counter increases or decreases the count value in response to a transition of said plurality of transitions;*

*generating the clock signal with a frequency determined by the count value.*

*33. The method of claim 32, wherein a first pair of said sample values are separated by a time delay equal at most to half a period of said clock signal.*

*34. The method of claim 32, wherein the control signals include an upcounting signal and a downcounting signal, the method further comprising:*

*(a) asserting the upcounting signal in response to said sample values indicating that the frequency of said clock signal is substantially less than a frequency associated with said digital input signal and*

*(b) asserting the downcounting signal in response to said sample values indicating that the frequency of said clock signal is substantially greater than the frequency associated with said digital input signal.*

*35. The method of claim 34, wherein said changing the count includes:*

*increasing the count value in response to a transition of said plurality of transitions if the upcounting signal is asserted, and,*

*decreasing the count value in response to the transition if the downcounting signal is asserted.*

*36. The method of claim 32 further comprising converting the count value to a control voltage, wherein the voltage controlled oscillator is configured to receive the control voltage, wherein the control voltage determines the frequency of the clock signal generated by the voltage controlled oscillator.*

*37. The method of claim 32, wherein said plurality of transitions are rising-edge transitions of the digital input signal.*

*38. The method of claim 32, wherein said plurality of transitions are falling-edge transitions of the digital input signal.*

*39. The method of claim 32, wherein said plurality of transitions include rising-edge transitions and falling-edge transitions of the digital input signal.*

*40. The method of claim 32, wherein two of said at least four sample values are captured from said clock signal in response to a current transition of said plurality of transitions, wherein remaining ones of said at least four sample values were captured from said clock signal in response to one or more previous transitions of said plurality of transitions.*

*41. A method comprising:*

*receiving a first clock signal and a digital input signal; and*

*outputting at least four sample values in response to each transition of a plurality of transitions of the digital input signal, wherein each of said sample values is a sample of the first clock signal;*

*changing a count value in response to transitions of said plurality of transitions;*

*operating on said at least four sample values outputted in response to each transition of said plurality of transitions in order to generate one or more control signals that determine whether the counter increases or decreases the count value in response to a transition of said plurality of transitions;*

*generating a second clock signal with a frequency determined by the count value, wherein the first clock signal has a frequency dependent on the frequency of the second clock signal.*

*42. The method of claim 41 further comprising frequency dividing the second clock signal in order to generate the first clock signal.*

*43. The method of claim 41, wherein said plurality of transitions are rising-edge transitions of the digital input signal.*

*44. The method of claim 41, wherein said plurality of transitions are falling-edge transitions of the digital input signal.*

*45. The method of claim 41, wherein said plurality of transitions include rising-edge transitions and falling-edge transitions of the digital input signal.*

*46. The method of claim 41, wherein two of said at least four sample values are captured from said first clock signal in response to a current transition of said plurality of transitions, wherein remaining ones of said at least four sample values were captured from said first clock signal in response to one or more previous transitions of said plurality of transitions.*

*47. A telecommunication device comprising:*

*a frequency comparator;*

*a sampling circuit configured to receive a clock signal and a digital input signal and to output at least four sample values to the frequency comparator in response to each transition of a plurality of transitions of the digital input signal, wherein each of said sample values is a sample of the clock signal;*

*a counter configured to change a count value in response to transitions of said plurality of transitions, wherein the frequency comparator is configured to operate on said sample values in order to generate one or more control signals that determine whether the counter increases or decreases the count value in response to a transition of said plurality of transitions;*

*a voltage-controlled oscillator configured to generate the clock signal with a frequency determined by the count value.*

*48. The telecommunication device of claim 47, wherein the telecommunication device is a receiver.*

*49. A telecommunication device comprising:*

*a frequency comparator;*

*a sampling circuit configured to receive a first clock signal and a digital input signal and to output at least four sample values to the frequency comparator in response to each transition of a plurality of transitions of the digital input signal, wherein each of said sample values is a sample of the first clock signal;*

*a counter configured to change a count value in response to transitions of said plurality of transitions, wherein the frequency comparator is configured to operate on said sample values in order to generate one or more control signals that determine whether the counter increases or decreases the count value in response to a transition of said plurality of transitions;*

*a voltage-controlled oscillator configured to generate a second clock signal with a frequency determined by the count value, wherein the first clock signal has a frequency dependent on the frequency of the second clock signal.*

*50. The telecommunication device of claim 49, wherein the telecommunication device is a receiver.*

*51. A system comprising:*

*a sampling circuit configured to receive a clock signal and a digital input signal and to output at least four sample*

*values in response to each transition of a plurality of transitions of the digital input signal, wherein each of said sample values is a sample of the clock signal;*

*a counter configured to change a count value in response to transitions of said plurality of transitions;*

*a frequency comparator that is distinct from the sampling circuit and is configured to operate on said sample values in order to generate one or more control signals that determine whether the counter increases or decreases the count value in response to a transition of said plurality of transitions;*

*a voltage-controlled oscillator configured to generate the clock signal with a frequency determined by the count value.*

*52. A system comprising:*

*a sampling circuit configured to receive a first clock signal and a digital input signal and to output at least four sample values in response to each transition of a plurality of transitions of the digital input signal, wherein each of said sample values is a sample of the first clock signal;*

*a counter configured to change a count value in response to transitions of said plurality of transitions;*

*a frequency comparator that is distinct from the sampling circuit and is configured to operate on said sample values in order to generate one or more control signals that determine whether the counter increases or decreases the count value in response to a transition of said plurality of transitions;*

*a voltage-controlled oscillator configured to generate a second clock signal with a frequency determined by the count value, wherein the first clock signal has a frequency dependent on the frequency of the second clock signal.*

*53. A system comprising:*

*a sampling circuit configured to receive a clock signal and a digital input signal and to output at least four sample values in response to each transition of a plurality of transitions of the digital input signal, wherein each of said sample values is a sample of the clock signal;*

*decision logic configured to receive said at least four outputted sample values from the sampling circuit and to operate on said at least four outputted sample values in order to generate one or more control signals;*

*a counter configured to change a count value in response to transitions of said plurality of transitions, wherein the one or more control signals determine whether the counter increases, decreases or maintains the count value in response to said transition of said plurality of transitions;*

*a voltage-controlled oscillator configured to generate the clock signal with a frequency determined by the count value.*

*54. A system comprising:*

*a sampling circuit configured to receive a first clock signal and a digital input signal and to output at least four sample values in response to each transition of a plurality of transitions of the digital input signal, wherein each of said sample values is a sample of the first clock signal;*

*decision logic configured to receive said at least four outputted sample values from the sampling circuit and to operate on said at least four outputted sample values in order to generate one or more control signals;*

*a counter configured to change a count value in response to transitions of said plurality of transitions, wherein the one or more control signals that determine whether the counter increases, decreases or maintains the count value in response to said transition of said plurality of transitions;*

*a voltage-controlled oscillator configured to generate a second clock signal with a frequency determined by the count value, wherein the first clock signal has a frequency dependent on the frequency of the second clock signal.*

*55. A system comprising:*

*a sampling circuit configured to receive a clock signal and a digital input signal and to capture a pair of samples of the clock signal in response to each of a plurality of transitions of the digital input signal, wherein the sampling circuit is configured so that the samples of each pair are separated in time by a fixed delay, wherein the sampling circuit is configured to output a current one and a previous one of said pairs in response to each transition of said plurality of transitions;*

*decision logic configured to operate on said current pair and said previous pair of samples in order to generate one or more control values;*

*a counter configured to increase, decrease or maintain a count value based on the one or more control values; and*

*a voltage-controlled oscillator configured to generate the clock signal with a frequency determined by the count value.*

*56. A system comprising:*

*a sampling circuit configured to receive a first clock signal and a digital input signal and to capture a pair of samples of the first clock signal in response to each of a plurality of transitions of the digital input signal, wherein the sampling circuit is configured so that the samples of each pair are separated in time by a fixed delay, wherein the sampling circuit is configured to output a current one and a previous one of said pairs in response to each transition of said plurality of transitions;*

*decision logic configured to operate on said current pair and said previous pair of samples in order to generate one or more control values;*

*a counter configured to increase, decrease or maintain a count value based on the one or more control values; and*

*a voltage-controlled oscillator configured to generate a second clock signal with a frequency determined by the count value, wherein the first clock signal has a frequency dependent on the frequency of the second clock signal.*

* * * * *